US008947170B2

(12) United States Patent
Yang et al.

(10) Patent No.: US 8,947,170 B2

(45) Date of Patent: Feb. 3, 2015

(54) SPIN-TORQUE OSCILLATOR

(75) Inventors: Tao Yang, Yokohama (JP); Kiwamu Kudo, Kamakura (JP); Tazumi Nagasawa, Yokohama (JP); Hirofumi Suto, Tokyo (JP); Rie Sato, Yokohama (JP); Koichi Mizushima, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 48 days.

(21) Appl. No.: 13/605,093

(22) Filed: Sep. 6, 2012

(65) Prior Publication Data

US 2013/0069730 A1 Mar. 21, 2013

(30) Foreign Application Priority Data

Sep. 21, 2011 (JP) ................................ 2011-205780

(51) Int. Cl.

*H03B 17/00* (2006.01)
*H03B 15/00* (2006.01)
*G11B 5/31* (2006.01)
*H01F 7/02* (2006.01)

(52) U.S. Cl.

CPC ............ *H03B 15/006* (2013.01); *H01F 7/0278* (2013.01); *G11B 5/3143* (2013.01)

USPC ........... 331/94.1; 335/306; 360/313; 257/295

(58) Field of Classification Search

CPC .... B82Y 10/00; H01L 51/00; H01L 51/0048; H01F 10/32; H03K 19/195; G11B 5/13

USPC .............. 331/3, 94.1; 977/932, 940; 335/209, 335/306; 360/125.3, 317, 119.03, 313; 257/421; 428/811.2; 326/104, 7

See application file for complete search history.

(56) References Cited

U.S. PATENT DOCUMENTS

| | | | | |
|---|---|---|---|---|
| 8,138,874 | B1 * | 3/2012 | Carlton et al. | 335/306 |
| 8,139,322 | B2 * | 3/2012 | Yamada et al. | 360/125.3 |
| 8,558,571 | B2 * | 10/2013 | Behin-Aein et al. | 326/7 |
| 2009/0157218 | A1 | 6/2009 | Otsuki et al. | |
| 2012/0056254 | A1 * | 3/2012 | Sasaki et al. | 257/295 |

(Continued)

FOREIGN PATENT DOCUMENTS

| | | |
|---|---|---|
| JP | 2009-146152 | 7/2009 |
| JP | 2012-049403 | 3/2012 |

OTHER PUBLICATIONS

Kiselev, S.I., et al; "Letters to Nature", 2003, vol. 425, pp. 380-383.

(Continued)

*Primary Examiner* — Arnold Kinkead

(74) *Attorney, Agent, or Firm* — Amin, Turocy & Watson, LLP

(57) ABSTRACT

According to one embodiment, a spin-torque oscillator includes a non-magnetic unit, one or more first magnetic unit, and a second magnetic unit. The non-magnetic unit is formed of a non-magnetic body. The one or more first magnetic unit is connected to the non-magnetic unit and generates a pure spin current indicating the flow of the electron spin that does not accompany an electric charge current. The second magnetic unit is connected to the non-magnetic unit in a manner such that a distance between the second magnetic unit and the first magnetic unit is shorter than a spin diffusion length indicating a distance that an electronic spin polarization is maintained in the non-magnetic unit. The second magnetic unit oscillates by the pure spin current.

6 Claims, 3 Drawing Sheets

100
104
Current source
105
Voltmeter
182
101 141 181
102
142
121
161 122
103
162

(56) References Cited

U.S. PATENT DOCUMENTS

2012/0133007 A1* 5/2012 Kimura et al. ................ 257/421
2013/0154633 A1 6/2013 Fujiwara et al.

OTHER PUBLICATIONS

Japanese Office Action for Japanese Application No. 2011-205780 mailed on Jun. 10, 2014.

* cited by examiner

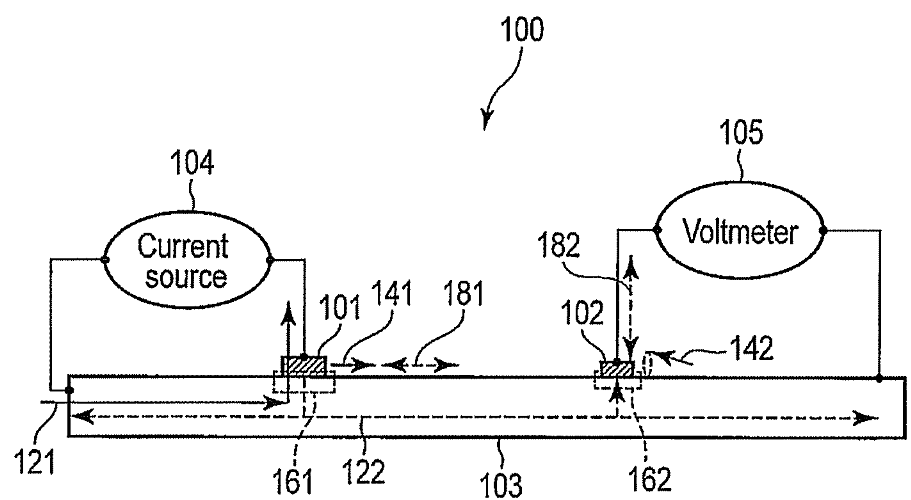
F I G. 1

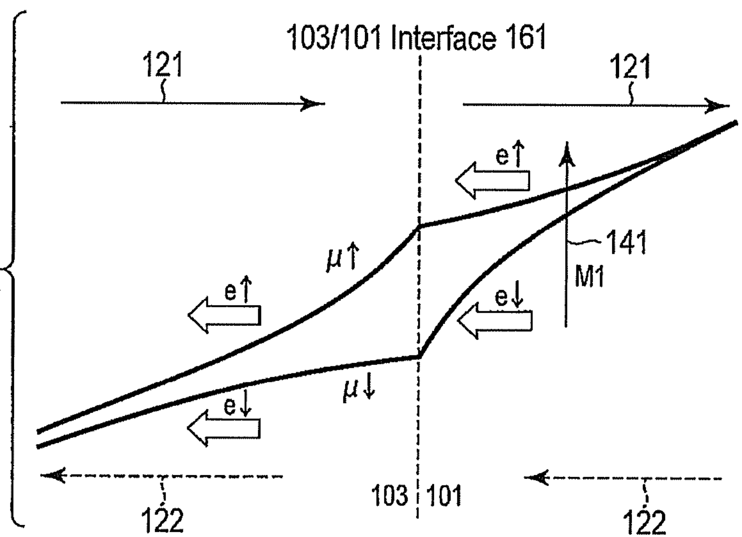
F I G. 2A
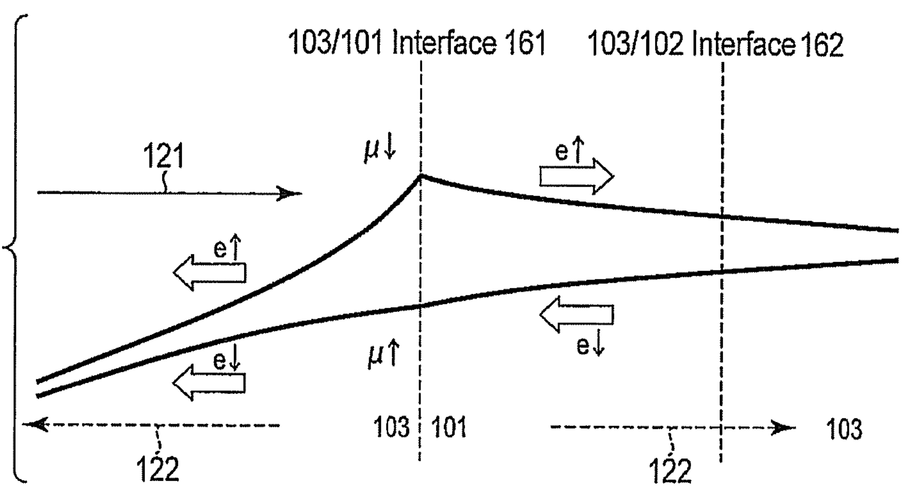
F I G. 2B
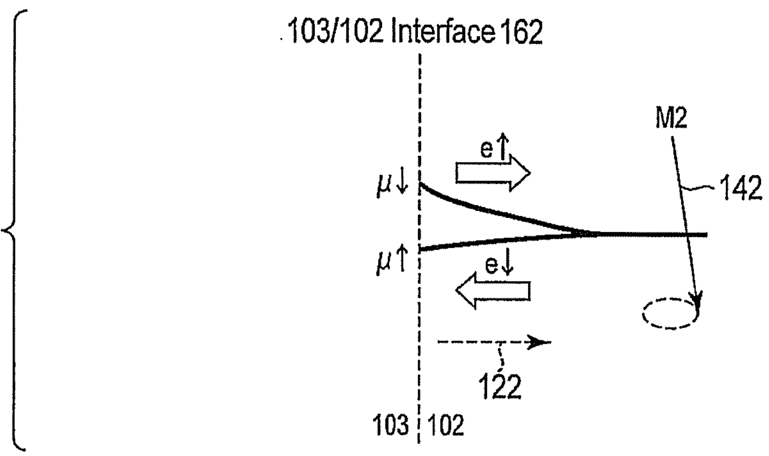
F I G. 2C

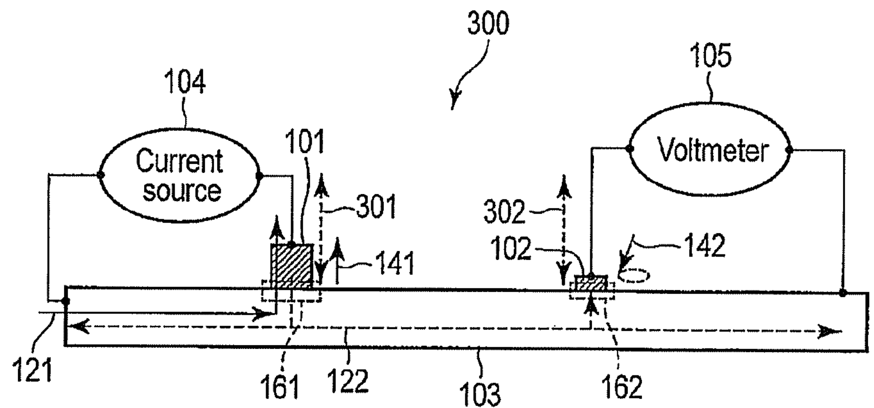
F I G. 3
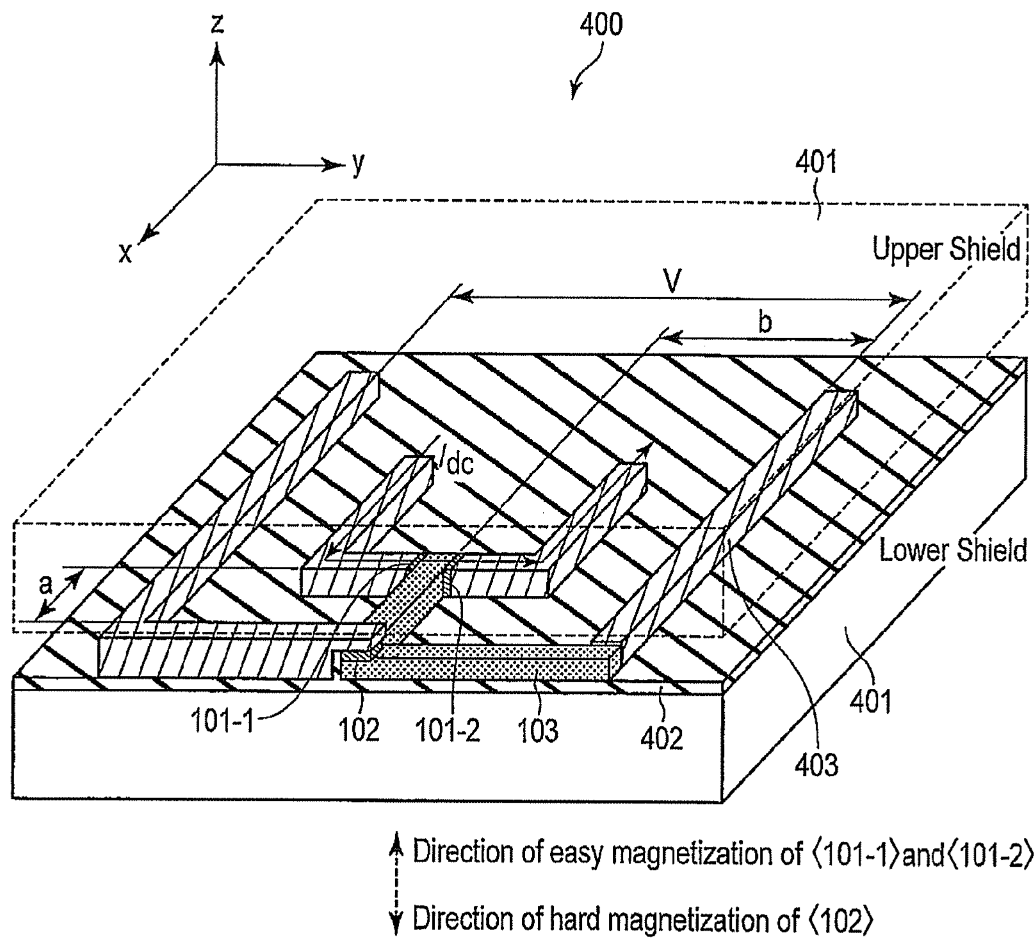
F I G. 4

SPIN-TORQUE OSCILLATOR

CROSS-REFERENCE TO RELATED APPLICATIONS

This application is based upon and claims the benefit of priority from Japanese Patent Application No. 2011-205780, filed Sep. 21, 2011, the entire contents of which are incorporated herein by reference.

FIELD

Embodiments described herein relate to a spin-torque oscillator.

BACKGROUND

A current-driven magnetization reversal using the spin-transfer effect in a micromagnet has been proposed as a method for writing in a magnetic memory, and products in which data is written using the spin-transfer effect have been developed. Similarly, it is proposed to apply a spin-torque oscillator realizing magnetization precession at several gigahertz to tens of gigahertz by using the spin-transfer effect to a reading and writing head in a next-generation large-capacity hard disk drive (HDD), and to communication technology.

As an example of application to the HDD reading and writing head, there is a recording method, which reduces the necessary writing field by injecting energy into the recording medium through ferromagnetic resonance induced by the high-frequency magnetic field generated by a spin-torque oscillator.

BRIEF DESCRIPTION OF THE DRAWINGS

FIG. 1 is a drawing showing the spin-torque oscillator according to the present embodiment.

FIGS. 2A, 2B and 2C are a drawing showing an example of spin accumulation and spin current generation in the spin-torque oscillator according to the present embodiment.

FIG. 3 is a drawing showing an example of the oscillating state of a spin-torque oscillator with the easy axis of one nanomagnet being parallel to the hard axis of another nanomagnet.

FIG. 4 is a drawing showing an example of a magnetic reading head using a spin-torque oscillator.

DETAILED DESCRIPTION

When applying a spin-torque oscillator to a device, stable oscillation is required. However, it is difficult to achieve stable oscillation of a spin-torque oscillator that excites precession of magnetization using the spin-transfer effect by conduction electron because of influence of heat caused by a current and non-uniform magnetic domain structure. In other words, Joule heat and current magnetic field are generated by a current applied to an oscillator to generate a spin current, and they affect the precession of magnetization and magnetic domain structure. A current spin-torque oscillator has a laminated structure comprising a magnetic layer that generates a spin current, an oscillating layer and a non-magnetic middle layer therebetween. Since usually the non-magnetic middle layer has a thickness of a few nanometers, magnetostatic interaction from the magnetic layer affects the oscillating layer; as a result, the oscillation of the oscillator is affected.

According to one embodiment, a spin-torque oscillator includes a non-magnetic unit, one or more first magnetic unit, and, a second magnetic unit. The non-magnetic unit is formed of a non-magnetic body. The one or more first magnetic unit is connected to the non-magnetic unit and generates a pure spin current which is not accompanied by a charge current. The second magnetic unit is connected to the non-magnetic unit in a manner such that a distance between the second magnetic unit and the first magnetic unit is shorter than a spin diffusion length indicating a distance that an electronic spin polarization is maintained in the non-magnetic unit. Excited by the pure spin current, the magnetization of the second magnetic unit oscillates.

In the following, the spin-torque oscillator according to the present embodiment will be explained in detail, with reference to the drawings. In the following embodiment, it should be assumed that a structural element that is denoted by the same reference number carries out the same operation. Redundant explanation will be avoided.

The spin-torque oscillator according to the present embodiment is explained with reference to FIG. 1.

The spin-torque oscillator 100 according to the present embodiment comprises a first micromagnetic body 101 (maybe referred to as a first magnetic unit), a second micromagnetic body 102 (maybe referred to as a second magnetic unit) and a non-magnetic thin line 103 (maybe referred to as a non-magnetic unit). A current source 104 is coupled to the first micromagnetic body 101 and the non-magnetic thin line 103. A voltmeter 105 is coupled to the second micromagnetic body 102 and non-magnetic thin line 103.

The first micromagnetic body 101 is, for example, a magnetic thin line or a magnetic dot, and is used for spin injection. Spin injection is injecting spin-polarized current into non-magnetic metal or a semiconductor. When a current 121 from the current source 104 (will be described later) is applied, the spins of the electrons are aligned by magnetization of a magnetic body. This phenomenon is called spin polarization.

The second micromagnetic body 102 is a magnetic dot, and is oscillated by a spin current 122. Thus, second micromagnetic body 102 is an oscillating body itself and used for spin detection. The first micromagnetic body 101 and the second micromagnetic body 102 may be made of ferromagnetic materials such as NiFe alloy.

The non-magnetic thin line 103 is made of materials having long spin diffusion length, such as Cu, Al, and Ag. The non-magnetic thin line 103 is coupled to the first micromagnetic body 101 and the second micromagnetic body 102. A spin diffusion length indicates a distance that spin polarization is maintained.

The current source 104 applies a current 121 to the non-magnetic thin line 103 to excite the oscillator. The current 121 flows from the non-magnetic thin line 103 to the first micromagnetic body 101.

The voltmeter 105 reads voltage change on the second micromagnetic body 102 to read the direction of magnetization of external magnetic bodies (for example, magnetization direction of a recording layer in a magnetic recording medium).

The magnetization 141 of the first micromagnetic body and the magnetization 142 of the second micromagnetic body are in an antiparallel alignment, namely, the direction of the magnetization 141 is opposite to that of the magnetization 142. If the current flows in a reverse direction, the magnetization 141 of the first micromagnetic body and the magnetization 142 of the second micromagnetic body may be in a parallel alignment.

The easy axis of magnetization 181 indicating a direction in which the first micromagnetic body 101 is easily magnetized is parallel to an interface, and the hard axis of magnetization 182 indicating a direction in which the second micromagnetic body 102 is not easily magnetized is vertical to the interface.

It is desirable to keep the dimension of each of the first micromagnetic body 101, the second micromagnetic body 102 and the non-magnetic thin line 103, and the gap between the first micromagnetic body 101 and the second micromagnetic body 102 as much as a few fractions of a spin diffusion length of the non-magnetic thin line 103 in order to avoid spin relaxation. If the first micromagnetic body 101 is formed of a thin line, “the dimension” refers to the width of the thin line, and the spin relaxation means that spin polarization is no longer maintained.

Next, generation of pure spin current in the spin-torque oscillator 100 according to the present embodiment, using a method of non-local spin injection is explained with reference to FIGS. 2A to 2C.

FIGS. 2A to 2C show the interfaces between the first micromagnetic body 101 and the non-magnetic thin line 103 and between the second micromagnetic body 102 and the non-magnetic thin line 103, and the flows of current and spin current near the interfaces.

When the current 121 flows from the non-magnetic thin line 103 to the first micromagnetic body 101, the electrons flow into the non-magnetic thin line 103 from the first micromagnetic body 101, and the spin current 122 flows in the direction opposite to the flow of the current 121. At this time, because of the spin-dependent scattering effect of electrons in the magnetic body, the number of electrons having a spin direction same as the magnetization 141 of the first micromagnetic body (hereinafter, referred to as spin-up electrons (e↑)) becomes greater than the number of electrons having a spin direction opposite to magnetization M1 141 of the micromagnetic body 101 (hereinafter, referred to as spin-down electrons (e↓)) around the interface. As a result, as shown in FIG. 2A, electrochemical potential (μ↑) of the spin-up electrons (e↑) is increased and electrochemical potential (μ↓) of the spin-down electrons (e↓) is decreased. Such a phenomenon, i.e. imbalance of electron spin, is called spin accumulation. Inversely, if a current flows from the first micromagnetic 101 to the non-magnetic thin line 103, spin-down electrons are accumulated.

As shown in FIG. 2B, since electrons diffuse from a place with higher electrochemical potential to a place with lower electrochemical potential, a spin-up electron (e↑) flows through a unit in which a current 121 does not flow in the non-magnetic thin line 103. As a result, a spin current 122 having the same direction as the spin-up electron (e↑) is generated. Concurrently, a spin-down electron (e↓) flows from the unit in which a current 121 does not flow in the non-magnetic thin line 103 to the interface between first micromagnetic body 101 and the non-magnetic thin line 103 (hereinafter, may be referred to as the first interface 161), and a spin current 122 having the same direction as the spin-down electron (e↓) is generated. Since the spin-down electron and the spin-up electron flow in an opposite direction, the current is counterbalanced. That is, a current 121 does not flow toward the interface between first micromagnetic body 102 and the non-magnetic thin line 103 (hereinafter, may be referred to as the first interface 162).

In contrast, since the spin direction and the flow direction of the spin-down electron and the spin-up electron are opposite to each other, the spin current 122 are not counterbalanced; rather, they are added. In other words, a spin current without current, i.e., a pure spin current, flows from the first interface 161 where the current 121 flows to the second interface 162 where no current flows. This procedure is called non-local spin injection.

Since the non-magnetic thin line 103 is made of a material having a long spin diffusion length, relaxation of the spin current 122 flowing through the non-magnetic thin line 103 is small. For this reason, as shown in FIG. 2C, spin accumulation can be generated on the second interface 162 at a distance from the first interface 161 less than or equal to the spin diffusion length of the non-magnetic thin line 103. Since the number of spin-up electrons (e↑) is greater than the number of spin-down electrons (e↓), by diffusion, the spin-up electrons (e↑) flows into the second micromagnetic body 102 from the second interface, and the spin-down electrons (e↓) flow into the second interface from the second micromagnetic body 102. In other words, the pure spin current also flows to the second micromagnetic body 102, and if the direction of magnetization M1 141 of the first micromagnetic body 101 is noncollinear to the direction of magnetization M2 142 of the second micromagnetic body 102, spin transfer effect is produced on the bodies 101 and 102. At this time, when magnetization M1 141 becomes closer to magnetization M2 142, a spin angular momentum is transferred to magnetization M2 142 and brings about torque; as a result, the precession of magnetization M2 142, i.e., oscillation, is activated. If magnetization M2 142 of the second micromagnetic body 102 is in precession, an electrochemical potential fluctuates at the oscillating frequency. Since the electrochemical potential of the non-magnetic thin line 103 does not fluctuate, a voltage (output voltage) between the second micromagnetic body 102 and the non-magnetic thin line 103 fluctuates at the same frequency in accordance with the fluctuation of electrochemical potential of the second micromagnetic body 102.

Thus, the micromagnetic body 101 and the second micromagnetic body 102 can be placed away at a distance in a manner such that the second micromagnetic body 102 can be oscillated and magnetostatic interaction of the magnetic bodies can be reduced, and stable oscillation of the micromagnetic body 102 can be achieved.

When a current is output from the current source 104, a lead line made of a material having a strong spin relaxation effect, such as gold, is connected to each of the first micromagnetic body 101 and the non-magnetic thin line 103. If the connecting point is close to the interface, spin accumulation at the first interface (the interface between the micromagnetic body 101 and the non-magnetic thin line 103), if any, the spin is absorbed to the lead line; as a result, the spin accumulated at the first surface will be reduced. For this reason, it is desirable to put a distance greater than the spin diffusion length of the non-magnetic thin line 103 between the first interface 161 and a point where the lead line is connected to the non-magnetic thin line 103.

Similarly, to measure an output voltage, a lead line made of a material having a strong spin relaxation effect, such as gold, is connected to each of the second micromagnetic body 102 and the non-magnetic thin line 103. To avoid absorption of spin into the lead line, it is desirable to put a distance greater than the spin diffusion length of the non-magnetic thin line 103 between the second interface 162 and a point where the lead line is connected to the non-magnetic thin line 103.

Further, since the spin transfer effect occurs near an interface, in order to oscillate the second micromagnetic body 102, it is necessary to keep the dimension of the non-magnetic thin line 103 in the direction vertical to the second interface should be kept less than a few nanometers. In this case, the hard axis of magnetization 182 of the second micromagnetic body 102 is vertical with respect to the interface.

FIG. 3 shows an example when the easy axis of magnetization of the first micromagnetic body 101 and the hard axis of magnetization of the second micromagnetic body 102 are in parallel. The configuration of the spin-torque oscillator 300 is the same as the configuration of the spin-torque oscillator 100 shown in FIG. 1, except that the easy axis of magnetization 301 of the first micromagnetic body 101 and the hard axis of magnetization 302 of the second micromagnetic body 102 are arranged in the same direction, and magnetization direction M1 141 and M2 142 are vertical with respect to the interface.

As shown in FIG. 3, when the easy axis of magnetization 301 of the first micromagnetic body 101 and the hard axis of magnetization 302 of the second micromagnetic body 102 are in parallel, the axis of the oscillation (precession) of the second micromagnetic body 102 is the same as the hard axis of magnetization 302. If so, the magnitude and frequency of a high frequency magnetic field can be easily adjusted by adjusting a current.

Next, the embodiment of fabricating the spin-torque oscillator 100 shown in FIG. 1 using a microfabrication method, such as ion milling and electronic beam lithography, is explained.

To make a difference in coercivity, the first micromagnetic body 101 and the second micromagnetic body 102 are made of NiFe alloy having a thickness of 20 nm and NiFe alloy having a thickness of 4 nm, respectively. The first magnetic body 101 and the second magnetic body 102 have shape magnetization anisotropy, the easy axes of magnetization of the magnetic bodies are in parallel, existing within a surface vertical to the direction of the thickness. To oscillate the second micromagnetic body 102, the thickness thereof should be 4 nm. The non-magnetic thin line 10 is a Cu thin line having a width of 250 nm and a thickness of 60 nm. The distance a between the first micromagnetic body 101 and the second micromagnetic body 102 should be around 250 nm.

The width of the non-magnetic thin line 103 and the distance between the first micromagnetic body 101 and the non-magnetic thin line 103 are sufficiently less than a spin diffusion length of the non-magnetic thin line 103 (Cu), that is, 1000 nm. Therefore, if a spin current flows from the first interface to the second interface, 25% of total spin flow will be lost but 75% can be secured.

Next, the efficiency of the above-explained spin injection to the spin-torque oscillator is explained.

A current of 1 mA is made to flow from the non-magnetic thin line 103 to the first micromagnetic body 101 by sweeping outer magnetic field in the direction of the easy axis of magnetization of the first micromagnetic body 101 and the second micromagnetic body 102. Then, as a result of measuring an output voltage when the magnetization direction in the first micromagnetic body 101 and the second micromagnetic body 102 is changed from parallel to anti-parallel, a change of approximately 4 μV in the output voltage can be obtained. According to the result, a spin current that flows into the second micromagnetic body 102 can be estimated as shown in Expression 1 below:

Expression 1

$$I_S = \frac{0.004 I_{dc}}{R_{SPy} P_{Py}} \frac{(1 + R_{SPy}/R_{SAu})e^{t/\lambda_{Py}} - (1 - R_{SPy}/R_{SAu})e^{-t/\lambda_{Py}}}{(1 + R_{SPy}/R_{SAu})e^{t/\lambda_{Py}} + (1 - R_{SPy}/R_{SAu})e^{-t/\lambda_{Py}} - 2}$$

Herein, $R_S$ is a spin resistance of a material, P is spin polarization of material, t is a thickness of the second micromagnetic body 102, λ is a spin diffusion length of a material, $P_y$ is NiFe alloy, Au is a lead line connected to the second micromagnetic body 102, $I_{dc}$ is a current that flows from the non-magnetic thin line 103 to the first micromagnetic body.

From Expression 1, it can be understood that a spin current with a density of approximately $6\times10^{10}$ $\mu m^2$ is made to flow into the second micromagnetic body 102 when a current of 10 mA is made to flow from the non-magnetic thin line 103 to the first micromagnetic body 101. This spin current density is at the same level as the spin current density required for magnetic oscillation by a spin torque. In other words, a magnetic body can be oscillated by precession of the second micromagnetic body 102 using a non-local spin injection at the spin-torque oscillator 100 shown in FIG. 1.

Next, an implementation example of the spin-torque oscillator 100 according to the present embodiment is explained with reference to FIG. 4.

FIG. 4 is a drawing showing a magnetic reading head 400 using the spin-torque oscillator 100. The magnetic reading head 400 comprises a first micromagnetic body 101-1 and 101-2, a second micromagnetic body 102, a non-magnetic thin line 103, a shield 401, an insulator 402, and a lead line 403.

Since common materials can be used for the shield 401 and the insulator 402, a specific explanation of the shield 401 and the insulator 402 is omitted.

As mentioned earlier, a material with a strong spin relaxation characteristic, such as gold (Au), is used for the lead line 403.

To improve the spin injection efficiency, two first micromagnetic bodies 101-1 and 101-2 which are anti-parallel in the magnetization direction, and they are connected in a manner such that the non-magnetic thin line 103 is located therebetween. As shown in FIG. 4, when a current $I_{dc}$ is applied to oscillate the second micromagnetic body 102, the output voltage fluctuates at the oscillating frequency of the magnetization; as a result, a high frequency signal is generated. If a leakage magnetic field from a storage medium is applied to the micromagnetic body 102, the frequency or amplitude of the high frequency signal will be changed. By detecting the change, information stored on the storage medium can be read.

To align the magnetization direction of the first micromagnetic body 101-1 and that of the first micromagnetic body 101-2 in an anti-parallel manner, different coercivity values are set for those two first micromagnetic bodies, or an antiferromagnetic body is used. As described above, the direction of spin accumulated at the first interface is reversed in accordance with whether an electron flows from the non-magnetic thin line 103 to the first micromagnetic body 101, or vice versa. If the magnetization direction of the first micromagnetic body 101 is reversed, the direction of spin accumulated at the first interface is also reversed. Thus, when a current flows from the first micromagnetic body 101-1 to the non-magnetic thin line 103, and when a current flows from the non-magnetic thin line 103 to the first micromagnetic body 101-2 which has the magnetization direction anti-parallel to the magnetization direction of the first micromagnetic body 101-1, spin-up electrons (e↑) are accumulated at each of the interfaces between the two first micromagnetic bodies 101-1 and 101-2 and the non-magnetic thin line 103. Therefore, since spin is accumulated twice as many as spin accumulated at one first interface, a spin current that flows into the second micromagnetic body 102 can be doubled. In other words, a current required to oscillate the second micromagnetic body

102 can be reduced, as a result, stable oscillation of the second micromagnetic body can be achieved.

According to the spin-torque oscillator according to the present embodiment that has been described above, by using a non-local spin injection of a pure spin current having no charge current, side effects caused by a Joule heat or a current magnetic field, etc. of a current can be avoided as exciting oscillation of a micromagnetic body of a spin-torque oscillator. Further, by putting a sufficient distance between a micromagnetic body that generates a spin current and a micromagnetic body (i.e., an oscillator), magnetostatic interaction from the magnetic body can be reduced; as a result, stable oscillation of an oscillator can be achieved.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A spin-torque oscillator comprising:

a non-magnetic unit formed of a non-magnetic body;

one or more first magnetic units connected to the non-magnetic unit and generating a pure spin current indicating the flow of the electron spin that does not accompany an electric charge current; and a second magnetic unit connected to the non-magnetic unit in a manner such that a distance between the second magnetic unit and the one or more first magnetic units is shorter than a spin diffusion length indicating a distance that an electronic spin polarization is maintained in the non-magnetic unit, the second magnetic unit oscillating by the pure spin current, wherein if the oscillator comprises two first magnetic units, the magnetization direction of one of the two first magnetic units and the magnetization direction of the other first magnetic unit are aligned in an anti-parallel manner, and the non-magnetic unit is placed between the two first magnetic units, and a first lead line to apply a current to one first magnetic unit and a second lead line to measure an output signal from the second magnetic unit is connected to the non-magnetic unit, each of the first lead line and the second lead line is connected to a first interface between the one first magnetic unit and the non-magnetic unit and the second interface between the second magnetic unit and the non-magnetic unit with a distance greater than the spin diffusion length, the spin diffusion length being of a material to which the first lead line and the second line are connected.

2. The oscillator according to claim 1, wherein a first magnetic unit of the one or more first magnetic units and the second magnetic unit are placed in a manner such that an easy axis of magnetization indicating a direction in which the first magnetic unit is easily magnetized and a hard axis of magnetization indicating a direction in which the second magnetic unit is not easily magnetized are in parallel.

3. The oscillator according to claim 1, wherein the first lead line to apply a current to the one first magnetic unit and a second lead line to measure an output signal from the second magnetic unit is connected to the non-magnetic unit, wherein each of the first lead line and the second lead line is connected to a first interface between the one first magnetic unit and the non-magnetic unit and the second interface between the second magnetic unit and the non-magnetic unit with a distance greater than the spin diffusion length, the spin diffusion length being of a material to which the first lead line and the second line are connected.

4. The oscillator according to claim 1, wherein a first magnetic unit of the one or more first magnetic units and the second magnetic unit are placed in a manner such that an easy axis of magnetization indicating a direction in which the first magnetic unit is easily magnetized and a hard axis of magnetization indicating a direction in which the second magnetic unit is not easily magnetized are in parallel.

5. The oscillator according to claim 2, wherein a first lead line to apply a current to the first magnetic unit and a second lead line to measure an output signal from the second magnetic unit is connected to the non-magnetic unit, wherein each of the first lead line and the second lead line is connected to a first interface between the first magnetic unit and the non-magnetic unit and the second interface between the second magnetic unit and the non-magnetic unit with a distance greater than the spin diffusion length, the spin diffusion length being of a material to which the first lead line and the second line are connected.

6. The oscillator according to claim 4, wherein a first lead line to apply a current to the first magnetic unit and a second lead line to measure an output signal from the second magnetic unit is connected to the non-magnetic unit, wherein each of the first lead line and the second lead line is connected to a first interface between the first magnetic unit and the non-magnetic unit and the second interface between the second magnetic unit and the non-magnetic unit with a distance greater than the spin diffusion length, the spin diffusion length being of a material to which the first lead line and the second line are connected.

* * * * *